United States Patent
Liu et al.

(10) Patent No.: US 8,361,346 B2
(45) Date of Patent: Jan. 29, 2013

(54) PHOSPHORS, FABRICATING METHOD THEREOF, AND LIGHT EMITTING DEVICE EMPLOYING THE SAME

(75) Inventors: Wei-Jen Liu, Taoyuan (TW); Yi-Chen Chiu, Hsinchu (TW); Yao-Tsung Yeh, Taoyuan (TW); Shyue-Ming Jang, Hsinchu (TW); Teng-Ming Chen, Hsinchu (TW); Jen-Chuen Liao, Hsinchu (TW); Li-Ching Chuo, Hualien County (TW); Fang-Yi Su, Yongkang (TW)

(73) Assignee: Industrial Technology Research Institute, Hsinchu County (TW)

( * ) Notice: Subject to any disclaimer, the term of this patent is extended or adjusted under 35 U.S.C. 154(b) by 518 days.

(21) Appl. No.: 12/647,545

(22) Filed: Dec. 28, 2009

(65) Prior Publication Data
US 2011/0050086 A1   Mar. 3, 2011

(30) Foreign Application Priority Data
Sep. 1, 2009 (TW) ................................ 98129375 A

(51) Int. Cl.
*C09K 11/59* (2006.01)
*C09K 11/61* (2006.01)
*C09K 11/55* (2006.01)

(52) U.S. Cl. .... 252/301.4 F; 252/301.4 H; 252/301.6 F; 313/503; 313/486; 313/487; 313/582; 313/584; 257/98

(58) Field of Classification Search ............ 252/301.4 F, 252/301.6 F, 301.4 H; 257/98; 313/503, 313/486, 487, 582, 584
See application file for complete search history.

(56) References Cited

U.S. PATENT DOCUMENTS

| | | |
|---|---|---|
| 6,255,670 B1 | 7/2001 | Srivastava et al. |
| 6,294,800 B1 | 9/2001 | Duggal et al. |
| 6,429,583 B1 | 8/2002 | Levinson et al. |
| 6,504,179 B1 | 1/2003 | Ellens et al. |
| 6,621,211 B1 | 9/2003 | Srivastava et al. |
| 6,632,379 B2 | 10/2003 | Mitomo et al. |
| 6,657,379 B2 | 12/2003 | Ellens et al. |
| 6,717,353 B1 | 4/2004 | Mueller et al. |
| 6,776,927 B2 | 8/2004 | Mitomo et al. |
| 6,809,347 B2 | 10/2004 | Tasch et al. |
| 6,936,857 B2 | 8/2005 | Doxsee et al. |
| 6,939,481 B2 | 9/2005 | Srivastava et al. |
| 6,943,380 B2 | 9/2005 | Ota et al. |

(Continued)

FOREIGN PATENT DOCUMENTS
TW         200841482 A    10/2008

OTHER PUBLICATIONS

Jacobsen et al.,"Synthesis, Structures and Luminescence of Two New Europium(II) Silicate-Chlorides, Eu2SiO3Cl2 and Eu5SiO4Cl6", Z. anorg. allg. Chem., vol. 620, 451-456, 1994.

(Continued)

*Primary Examiner* — Carol M Koslow
(74) *Attorney, Agent, or Firm* — Pai Patent & Trademark Law Firm; Chao-Chang David Pai

(57) ABSTRACT

The invention provides a phosphor composed of $(M_{1-x}RE_x)_5 SiO_{4-y}X_{6+2y}$, wherein M is Ba individually or in combination with at least one of Mg, Ca, Sr, or Zn; RE is Y, La, Pr, Nd, Eu, Gd, Tb, Ce, Dy, Yb, Er, Sc, Mn, Zn, Cu, Ni, or Lu; X is F, Cl, Br, or combinations thereof; $0.001 \leq x \leq 0.6$, and $0.001 \leq y \leq 1.5$. Under excitation, the phosphor of the invention emits visible light and may be collocated with other phosphors to provide a white light illumination device.

18 Claims, 7 Drawing Sheets

U.S. PATENT DOCUMENTS 6,982,045 B2 1/2006 Menkara et al.
7,276,183 B2 10/2007 Tian
2008/0061271 A1 3/2008 Takahara et al.

OTHER PUBLICATIONS

Abed et al., "Zur Kristallstruktur von Ba5SiO4Cl6", Journal of Alloys and Compounds, vol. 190, 61-64, 1992, JALCOM 396.

Zeng et al., "Ba5SiO4Cl6:Eu2+: An intense blue emission phosphor under vacuum ultraviolet and near-ultraviolet excitation", Applied Physics Letters, vol. 88, 051906, 2006.

Xia et al., "Luminescence properties of Ba5SiO4(F, Cl)6:Eu2+ phosphor", Materials Letters, vol. 61, 1885-1888, 2007, Elsevier.

Meijerink et al., "Luminescence and temperature dependent decay behaviour of divalent europium in Ba5SiO4X6 (X=Cl, Br)", Journal of Luminescence, vol. 47, 1-5, 1990, North-Holland.

"Luminescent Properties of Eu2+-Doped Sr5SiO4Cl6 Blue-White Phosphor", Journal of the Chinese Rare Earth Society, vol. 25, No. 6, Dec. 2007.

PHOSPHORS, FABRICATING METHOD THEREOF, AND LIGHT EMITTING DEVICE EMPLOYING THE SAME

CROSS REFERENCE TO RELATED APPLICATIONS

This application is based upon and claims the benefit of priority from the prior Taiwan Patent Application No. 098129375, filed on Sep. 1, 2009, the entire contents of which are incorporated herein by reference.

BACKGROUND OF THE INVENTION

1. Field of the Invention

The present invention relates to a blue phosphor, and in particular relates to a light emitting device, a cold cathode fluorescent lamp, or a plasma display panel employing the same.

2. Description of the Related Art

Conventional tungsten lamps or fluorescent lamps of white light illumination devices have been gradually replaced by commercially available light emitting diodes (herein after LEDs). Advantages of LEDs are as follows: (1) the small size of LEDs make them suitable to be illumination devices of array packages and collocated with different colors, if necessary; (2) LEDs have relatively long operating life spans of more than 10,000 hours, which is 50 times that of conventional tungsten lamps; (3) LEDs have shock resistance and are durable due to transparent resin being applied as a packaging resin; (4) LEDs are environmentally friendly as the interior structures are free of mercury; (5) LEDs consume ⅓ to ⅕ less power than that of the conventional tungsten lamp.

Generally, white light is a mixture of at least one colored light. For example, the white light seen by a human eye can be formed by mixing blue and yellow lights or mixing blue, green, and red lights. The former white light is a two-wavelength white light, and the latter is tee-wavelength white light white light.

The three most common commercially available semiconductor white light devices are described as follows. The first is a white light illumination device collocated by red, green, and blue LED chips. This white light module has high luminescence efficiency and high color rendering. However, the different colored LED chips require different epitaxial materials, wherein different electrical voltages are needed. Accordingly, the manufacturing cost is high, the circuit layout is complicated, and the appropriate mixing of the different colored lights is difficult.

The second is a white light illumination device disclosed by Nichia Corporation. The most common version is the white light formed by a yellow YAG phosphor excited by a blue LED. The periphery of the blue LED is filled with optical gel sealing the yellow YAG phosphor. The blue LED emits a blue light having a wavelength of about 400 nm to 530 nm. The yellow YAG phosphor is excited by a part of the blue light and then emits a yellow light. The remaining part of the blue light collocates with the yellow light to form a two-wavelength white light.

The described two-wavelength (blue and yellow) white LED has many illumination limitations due to the high color temperatures and uneven colors. Therefore, color quality is less than desired. Next, color control of the white light is difficult due to the blue light wavelength from the LED chip changing along with different temperatures thereof. In addition, the two-wavelength white light lacks red light, thereby reducing color rendering thereof.

The third white light illumination device is formed by blue, green, and red phosphors evenly dispersed in optical gel. After being excited, the phosphors emit red, green, and blue light which further collocate to provide a three-wavelength white light. Although the luminescence efficiency thereof is relatively lower, the three-wavelength white light has high color rendering. Additionally, the manufacturing process of the third white light illumination device is relatively more flexible than that of the first and second white light illumination devices. Most phosphors are sulfide, nitride, or oxide phosphors. While sulfide phosphors usually have high luminescence efficiency, they are also unstable and may easily degrade due to moisture or oxygen. As for nitride phosphors, while they are usually stable, they are also costly due to the difficulty of synthesizing the nitrides in high temperature/pressure conditions.

Please refer to Table 1, which shows the conventional silicate phosphors as disclosed in related patents.

TABLE 1

| Pat. No. | Phosphors |
| --- | --- |
| U.S. Pat. No. 6,982,045 | $Sr_xBa_yCa_zSiO_4$:Eu |
| | $Sr_xBa_yCa_zSiO_4$:Eu, B |
| | (B = Ce, Mn, Ti, Pb, Sn) |
| U.S. Pat. No. 6,943,380 | $(2-x-y)SrO\bullet x(Ba, Ca)O\bullet(1-a-b-c-d)SiO_2\bullet aP_2O_5\bullet bAl_2O_3\bullet cB_2O_3\bullet dGeO_2$:y$Eu^{2+}$ |
| U.S. Pat. No. 6,939,481 | $(Ba, Sr, Ca)_2SiO_4$:$Eu^{2+}$ |
| U.S. Pat. No. 6,936,857 | $Ca_8Mg(SiO_4)_4C_{12}$:$Eu^{2+}$, $Mn^{2+}$ |
| | $Sr_4Al_{14}O_{25}$:$Eu^{2+}$(SAE) |
| | $(Tb_{1-x-y}A_xRE_y)_3D_zO_{12}$(YAG/TAG) |
| U.S. Pat. No. 6,809,347 | $(2-x-y)SrO\bullet x(Ba, Ca)O\bullet(1-a-b-c-d)SiO_2\bullet aP_2O_5\bullet bAl_2O_3\bullet cB_2O_3\bullet dGeO_2$:y$Eu^{2+}$ |
| U.S. Pat. No. 6,776,927 | $Ca_xSi_{12-(m+n)}Al_{(m+n)}O_nN_{16-n}$:$Eu_y$,$Dy_z$ |
| U.S. Pat. No. 6,717,353 | $(Sr_{1-x-a}Ba_x)_3MgSi_2O_8$:$Eu_a$ |
| | $(Y_{1-a})_2SiO_5$:$Ce_a$ |
| U.S. Pat. No. 6,657,379 | $M_{p/2}Si_{12-p-q}Al_{p+q}O_qN_{16-q}$:$Eu^{2+}$ |
| | M = Ca or in combination with Sr or Mg |
| U.S. Pat. No. 6,632,379 | $(Ca_x, M_y)(Si, Al)_{12}(O, N)_{16}$ |
| | M = Eu, Tb, Yb, Er |
| U.S. Pat. No. 6,621,211 | $A_2SiO_4$:$Eu^{2+}$ |
| | $A_2DSi_2O_7$:$Eu^{2+}$ |
| | A includes at least one of Sr, Ca, Ba or Mg |
| | D includes at least one of Mg or Zn; |
| U.S. Pat. No. 6,504,179 | $Ca_{8-x-y}Eu_xMn_yMg(SiO_4)_4Cl_2$ |
| | x = 0.005~1.6 and y = 0~0.1 |
| U.S. Pat. No. 6,429,583 | $Ba_2MgSi_2O_7$:$Eu^{2+}$; $Ba_2SiO_4$:$Eu^{2+}$ |
| U.S. Pat. No. 6,294,800 | $Ca_8Mg(SiO_4)_4Cl_2$:$Eu^{2+}$, $Mn^{2+}$ |
| U.S. Pat. No. 6,255,670 | $A_2DSi_2O_7$:$Eu^{2+}$ |
| | $Ba_2(Mg, Zn)Si_2O_7$:$Eu^{2+}$ |
| | $(Ba_{1-x-y-z}Ca_xSr_yEu_z)_2(Mg_{1-w}, Zn_w)Si_2O_7$ |

The invention provides novel halosilicate phosphors with improved luminescent intensity in comparison with conventional LED phosphors.

BRIEF SUMMARY OF THE INVENTION

The invention provides a halosilicate phosphor composed of $(M_{1-x}RE_x)_5SiO_{4-y}X_{6+2y}$, wherein M is Ba individually or in combination with at least one of Mg, Ca, Sr, or Zn; RE is Y, La, Pr, Nd, Eu, Gd, Tb, Ce, Dy, Yb, Er, Sc, Mn, Zn, Cu, Ni, or Lu; X is F, Cl, Br, or combinations thereof; $0.001 \leq x \leq 0.6$, and $0.001 \leq y \leq 1.5$.

In another embodiment of the invention, a method for fabricating the aforementioned halosilicate phosphor is also provided, which includes the following steps: mixing a mixture including the following components: (1) barium- and oxygen-containing compounds; (2) RE and oxygen-containing compounds; (3) silica; and (4) barium-containing halide, and sintering the mixture under a reductive atmosphere. Further, the components can include (5) oxygen-containing compounds containing magnesium, calcium, strontium, or zinc.

The invention also provides a light emitting device, including an excitation light source and the aforementioned phosphor.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
FIG. 1 is a cross section of a fluorescent lamp to an embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

The invention provides a phosphor having a formula:

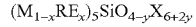

$$(M_{1-x}RE_x)_5SiO_{4-y}X_{6+2y}$$

wherein, M is Ba individually or in combination with at least one of Mg, Ca, Sr, or Zn; RE is Y, La, Pr, Nd, Eu, Gd, Tb, Ce, Dy, Yb, Er, Sc, Mn, Zn, Cu, Ni, Lu, or combinations thereof; X is F, Cl, Br, or combinations thereof; $0.001 \leq x \leq 0.6$; and $0.001 \leq y \leq 1.5$.

In an embodiment of the invention, M can consist of Ba, and RE can be Eu or Mn. Accordingly, the phosphor of the invention can be $(Ba_{1-x}Eu_x)_5SiO_{4-y}X_{6+2y}$. Further, M can include Ba and further include at least one Ca, Sr, and, Zn, and the phosphor of the invention can be $[(Ba_{1-z}Mg_z)_{1-x}Eu_x]_5SiO_{4-y}X_{6+2y}$, $[(Ba_{1-z}Ca_z)_{1-x}Eu_x]_5SiO_{4-y}X_{6+2y}$, $[(Ba_{1-z}Sr_z)_{1-x}Eu_x]_5SiO_{4-y}X_{6+2y}$, or $[(Ba_{1-z}Zn_z)_{1-x}Eu_x]_5SiO_{4-y}X_{6+2y}$, wherein $0.001 \leq z \leq 0.4$.

Further, X can be individually or in combination with at least one of F, Cl and Br, and the phosphor of the invention can be $(M_{1-x}RE_x)_5SiO_{4-y}Cl_{6+2y}$, $(M_{1-x}RE_x)_5SiO_{4-y}(Cl_{1-w}F_w)_{6+2y}$, or $(M_{1-x}RE_x)_5SiO_{4-y}(Cl_{1-w}Br_w)_{6+2y}$, wherein $0.001 \leq w \leq 0.3$. According to embodiments of the invention, x can be within the following ranges: $0.001 \leq x \leq 0.1$, $0.1 \leq x \leq 0.2$, $0.2 \leq x \leq 0.3$, $0.3 \leq x \leq 0.4$, $0.4 \leq x \leq 0.5$, or $0.5 \leq x \leq 0.6$, and x can be within the following ranges: $0.001 \leq y \leq 0.1$, $0.1 \leq y \leq 0.5$, $0.5 \leq y \leq 1$, or $1 \leq y \leq 1.5$. The phosphor of the invention can be excited by a light with a wavelength of between 130-430 nm to emit a blue light having a major emission peak of between 445-455 nm and a CIE coordination of (0.15, 0.06).

In embodiments of the invention, a method for fabricating the aforementioned phosphor is provide, including the following steps: mixing a mixture which includes the following components: (1) barium- and oxygen-containing compounds; (2) RE- and oxygen-containing compounds; (3) silica; and (4) barium-containing halide; and sintering the mixture under a reductive atmosphere. Further, the mixture further includes (5) oxygen-containing compounds containing magnesium, calcium, strontium, or zinc. The step of sintering the mixture can have a sintering temperature of between 800-1000° C., and the mixture can be sintered at the sintering temperature for 0.5-32 hrs.

According to embodiments of the invention, (1) barium- and oxygen-containing compounds can include barium oxide, barium carbonate, or combinations thereof; (2) RE- and oxygen-containing compounds can include oxide containing Y, La, Pr, Nd, Eu, Gd, Tb, Ce, Dy, Yb, Er, Sc, Mn, Zn, Cu, or Ni, or combinations of the previous mentioned metal oxides; and (4) barium-containing halide includes barium chloride, barium bromide, barium fluoride, or combinations thereof. Further, the reductive atmosphere includes hydrogen gas and a carrier gas such inert gas.

According to embodiments of the invention, a light emitting device is also provided, including an excitation light source and the aforementioned phosphor. The excitation light source (configured to emit a radiation having a wavelength ranging from about 250 to 420 nm) can include a light emitting diode (LED), a laser diode (LD), a vacuum ultraviolet (VUV), or Hg vapor arc.

The light emitting device can be an external electrode fluorescent lamp (EEFL), a liquid crystal display (LCD), an organic light emitting diode (OLED), a plasma display panel (PDP), a light emitting diode (LED) device, or a cold cathode fluorescent lamp (CCFL), such as a white light emitting device. Since the phosphors of the invention can be blue phosphors, the white light emitting device employing the aforementioned phosphors of the invention may employ UV or blue light excitable yellow phosphors. The yellow phosphor includes $Y_3Al_5O_{12}:Ce^{3+}$(YAG), or $Tb_3Al_5O_{12}:Ce^{3+}$ (TAG).

Further, the white light emitting device employing the aforementioned phosphors of the invention may employ UV or blue light excitable red or green phosphors.

The red phosphor includes $Sr_3SiO_5:Eu^{2+}$, $Ba_3MgSi_2O_8$: $Eu^{2+}$, $Mn^{2+}$, or ZnCdS:AgCl, and the green phosphor includes $BaMgAl_{10}O_{17}:Eu^{2+}$, $Mn^{2+}$(BAM-Mn), $SrSi_2N_2O_2$: $Eu^{2+}$, $CaSc_2O_4:Ce^{3+}$, $Ca_3Sc_2Si_3O_{12}:Ce^{3+}$, or $Ca_8Mg(SiO_4)_4Cl_2:Eu^{2+}$, $Mn^{2+}$. The light emitting device can serve as a pilot device (such as traffic sign, and pilot lamp of an instrument), a back light source (such as back light of an instrument and display), or a lighting fitting (such as a bias light, traffic sign, or signboard).

According to an embodiment of the invention, referring to FIG. 1, the light emitting device 10 has a lamp tube 12, a phosphor disposed on the inside walls of the lamp tube 12, an excitation light source 16, and electrodes 18 disposed on each of the two ends of the lamp tube 12. Further, the lamp tube 12 of the light emitting device 10 can further include Hg and an inert gas. The phosphor 14 can include the halosilicate phosphor of the invention. Moreover, the phosphor 14 can further include a yellow phosphor, or a combination of a red phosphor and a green phosphor for generating white-light radiation. The light emitting device 10 can serve as a back light source of a liquid crystal display.

Figure 2:
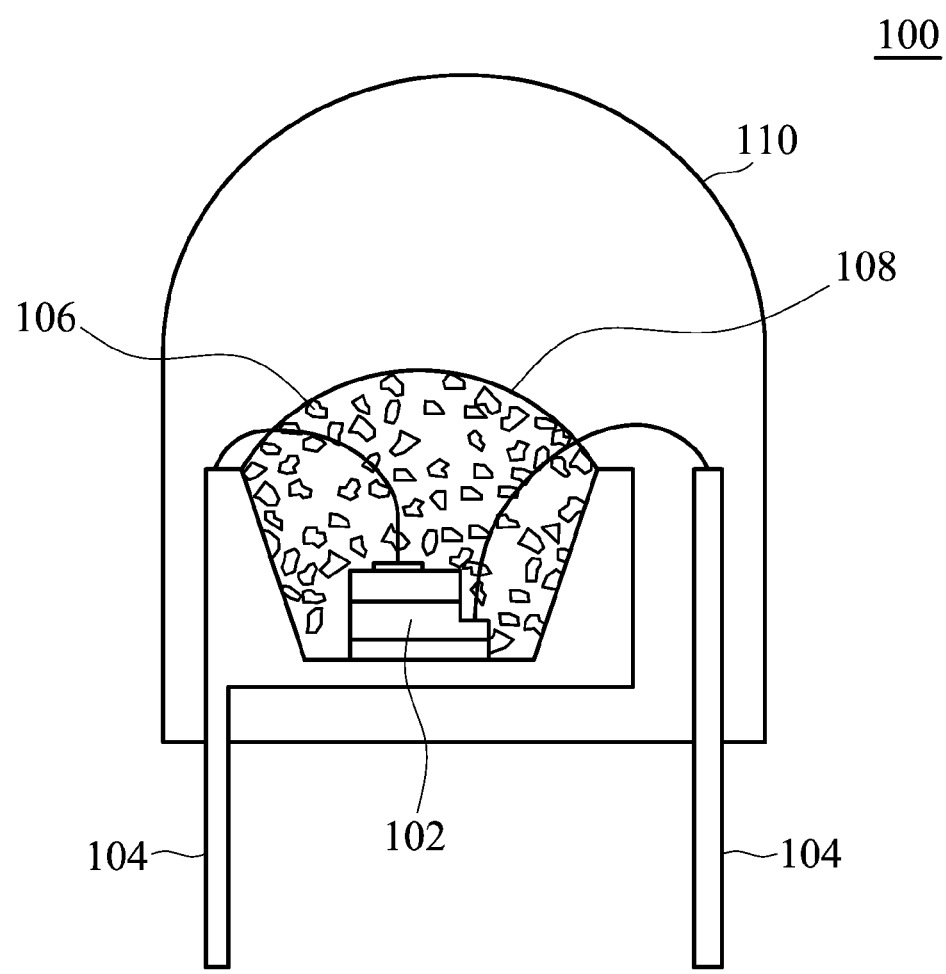
FIG. 2 is a cross section of a light emitting device according to another embodiment of the invention.

According to another embodiment of the invention, referring to FIG. 2, the light emitting device 100 employs a light emitting diode or laser diode 102 as an excitation light source, and the light emitting diode or laser diode 102 are disposed on a lead frame 104. A transparent resin 108 mixed with a phosphor 106 is coated to cover the light emitting diode or laser diode 102. A sealing material 110 is used to encapsulate the light emitting diode or laser diode 102, the lead frame 104, and the transparent resin 108.

The following examples are intended to illustrate the invention more fully without limiting their scope, since numerous modifications and variations will be apparent to those skilled in this art.

EXAMPLE 1

Figure 3:
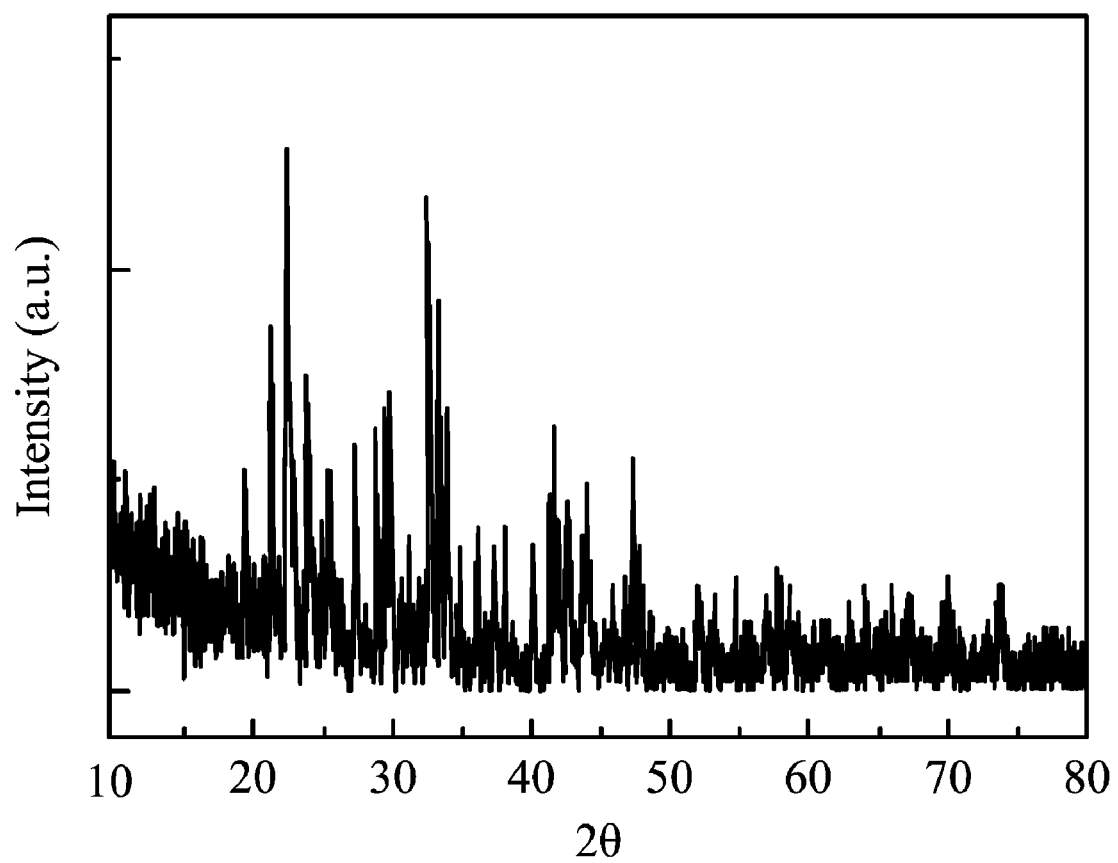
FIG. 3 shows the X-ray pattern of the phosphor as disclosed in Example 1.
Figure 4:
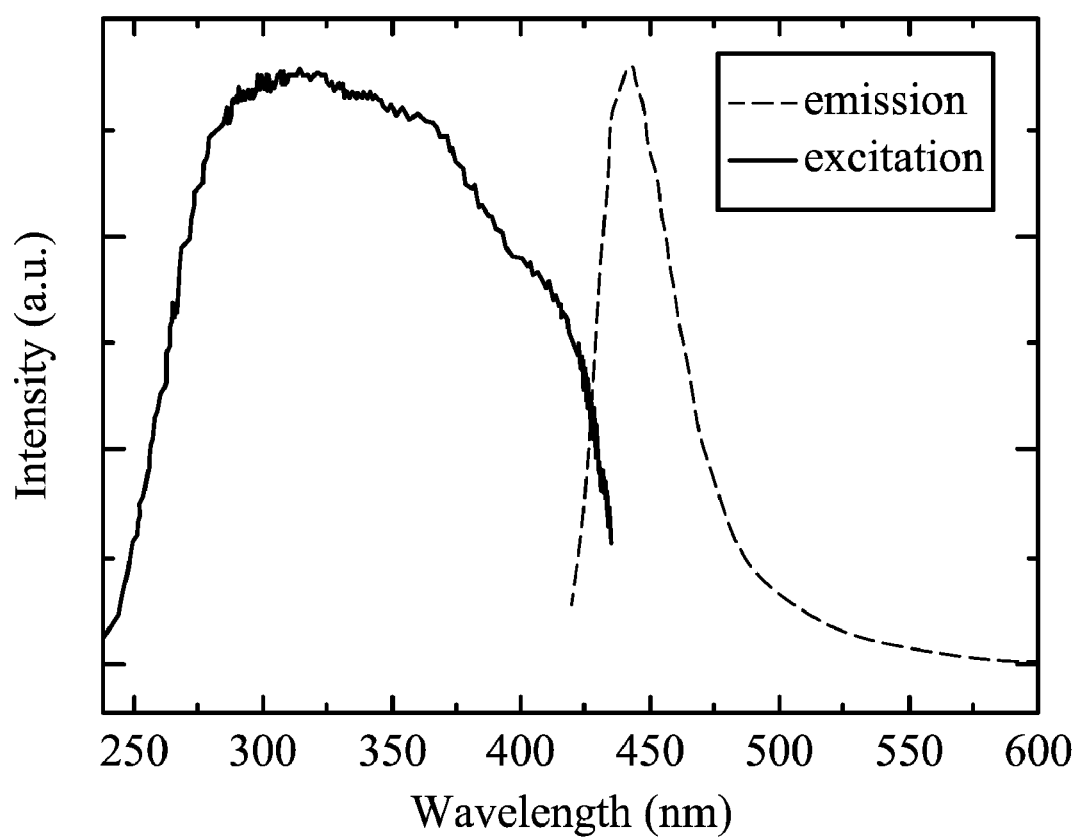
FIG. 4 shows photoluminescence excitation and photoluminescence spectra of the phosphor as disclosed in Example 1 (excited by a 400 nm violet light).

1.99 mol of $BaCO_3$ (0.4909 g, FW=197.338, commercially available from ALDRICH, 99.99%), 0.005 mol of $Eu_2O_3$ (0.0044 g, FW=351.917, commercially available from ALDRICH), 1.00 mol of $SiO_2$ (0.0751 g, FW=60.084, commercially available from STREM), and 3.15 mol of $BaCl_2 \cdot 2H_2O$ (0.9618 g, FW=244.27, commercially available from STREM) were weighted, evenly mixed and grinded, and charged in a alumina crucible. The alumina crucible was then heated in a high temperature furnace. After sintering at 900° C. for 8 hours under 15% $H_2$/85% $N_2$, washing, filtering, and heat drying, a pure phase of the halosilicate phosphor $(Ba_{0.998}Eu_{0.002})_5SiO_{3.85}Cl_{6.30}$ was prepared. The excitation wavelength, emission wavelength, and relative emission intensity (set as 100) of the described product are measured and the results are shown in Table 2. Further, the X-ray diffraction pattern of the described product is shown in FIG. 3 and the excitation and photoluminescence spectra of the described product are shown in FIG. 4. The phosphor had wide excitation band, and the major peak of the emission band was 450 nm.

EXAMPLE 2

1.49 mol of $BaCO_3$ (0.3675 g, FW=197.338, commercially available from ALDRICH, 99.99%), 0.30 mol of $MgCO_3$ (0.0316 g, FW=84.313, commercially available from ALDRICH), 0.005 mol of $Eu_2O_3$ (0.0044 g, FW=351.917, commercially available from ALDRICH), 1.00 mol of $SiO_2$ (0.0751 g, FW=60.084, commercially available from STREM), and 3.15 mol of $BaCl_2 \cdot 2H_2O$ (0.9618 g, FW=244.27, commercially available from STREM) were weighted, evenly mixed and grinded, and charged in a alumina crucible. The alumina crucible was then heated in a high temperature furnace. After sintering at 900° C. for 8 hours under 15% $H_2$/85% $N_2$, washing, filtering, and heat drying, a pure phase of the halosilicate phosphor $(Ba_{0.938}Mg_{0.06}Eu_{0.002})_5SiO_{3.85}Cl_{6.30}$ was prepared. The excitation wavelength, emission wavelength, and relative emission intensity (in comparison with the phosphor of Example 1) of the described product were measured and the results are shown in Table 2.

EXAMPLE 3

1.49 mol of $BaCO_3$ (0.3675 g, FW=197.338, commercially available from ALDRICH, 99.99%), 0.30 mol of $CaCO_3$ (0.0375 g, FW=100.086, commercially available from ALDRICH), 0.005 mol of $Eu_2O_3$ (0.0044 g, FW=351.917, commercially available from ALDRICH), 1.00 mol of $SiO_2$ (0.0751 g, FW=60.084, commercially available from STREM), and 3.15 mol of $BaCl_2 \cdot 2H_2O$ (0.9618 g, FW=244.27, commercially available from STREM) were weighted, evenly mixed and grinded, and charged in a alumina crucible. The alumina crucible was then heated in a high temperature furnace. After sintering at 900° C. for 8 hours under 15% $H_2$/85% $N_2$, washing, filtering, and heat drying, a pure phase of the halosilicate phosphor $(Ba_{0.938}Ca_{0.06}Eu_{0.002})_5SiO_{3.85}Cl_{6.30}$ was prepared. The excitation wavelength, emission wavelength, and relative emission intensity (in comparison with the phosphor of Example 1) of the described product were measured and the results are shown in Table 2.

EXAMPLE 4

1.49 mol of $BaCO_3$ (0.3675 g, FW=197.338, commercially available from ALDRICH, 99.99%), 0.30 mol of $SrCO_3$ (0.0553 g, FW=147.618, commercially available from ALDRICH), 0.005 mol of $Eu_2O_3$ (0.0044 g, FW=351.917, commercially available from ALDRICH), 1.00 mol of $SiO_2$ (0.0751 g, FW=60.084, commercially available from STREM), and 3.15 mol of $BaCl_2 \cdot 2H_2O$ (0.9618 g, FW=244.27, commercially available from STREM) were weighted, evenly mixed and grinded, and charged in a alumina crucible. The alumina crucible was then heated in a high temperature furnace. After sintering at 900° C. for 8 hours under 15% $H_2$/85% $N_2$, washing, filtering, and heat drying, a pure phase of the halosilicate phosphor $(Ba_{0.938}Sr_{0.06}Eu_{0.002})_5SiO_{3.85}Cl_{6.30}$ was prepared. The excitation wavelength, emission wavelength, and relative emission intensity (in comparison with the phosphor of Example 1) of the described product were measured and the results are shown in Table 2.

EXAMPLE 5

1.49 mol of $BaCO_3$ (0.3675 g, FW=197.338, commercially available from ALDRICH, 99.99%), 0.30 mol of ZnO (0.0305 g, FW=81.389, commercially available from ALDRICH), 0.005 mol of $Eu_2O_3$ (0.0044 g, FW=351.917, commercially available from ALDRICH), 1.00 mol of $SiO_2$ (0.0751 g, FW=60.084, commercially available from STREM), and 3.15 mol of $BaCl_2 \cdot 2H_2O$ (0.9618 g, FW=244.27, commercially available from STREM) were weighted, evenly mixed and grinded, and charged in a alumina crucible. The alumina crucible was then heated in a high temperature furnace. After sintering at 900° C. for 8 hours under 15% $H_2$/85% $N_2$, washing, filtering, and heat drying, a pure phase of the borate phosphor $(Ba_{0.938}Zn_{0.06}Eu_{0.002})_5SiO_{3.85}Cl_{6.30}$ was prepared. The excitation wavelength, emission wavelength, and relative emission intensity (in comparison with the phosphor of Example 1) of the described product were measured and the results are shown in Table 2.

EXAMPLE 6

1.99 mol of $BaCO_3$ (0.4909 g, FW=197.338, commercially available from ALDRICH, 99.99%), 0.005 mol of $Eu_2O_3$ (0.0044 g, FW=351.917, commercially available from ALDRICH), 1.00 mol of $SiO_2$ (0.0751 g, FW=60.084, commercially available from STREM), 2.625 mol of $BaCl_2 \cdot 2H_2O$ (0.8015 g, FW=244.27 commercially available from STREM), and 0.525 mol of $BaF_2$ (0.1151 g, FW=175.326, commercially available from STREM) were weighted, evenly mixed and grinded, and charged in a alumina crucible. The alumina crucible was then heated in a high temperature furnace. After sintering at 900° C. for 8 hours under 15% $H_2$/85% $N_2$, washing, filtering, and heat drying, a pure phase of the borate phosphor $(Ba_{0.998}Eu_{0.002})_5SiO_{3.85}Cl_{5.250}F_{1.05}$ was prepared. The excitation wavelength, emission wavelength, and relative emission intensity (in comparison with the phosphor of Example 1) of the described product were measured and the results are shown in Table 2.

EXAMPLE 7

1.99 mol of $BaCO_3$ (0.4909 g, FW=197.338, commercially available from ALDRICH, 99.99%), 0.005 mol of $Eu_2O_3$ (0.0044 g, FW=351.917, commercially available from ALDRICH), 1.00 mol of $SiO_2$ (0.0751 g, FW=60.084, commercially available from STREM), 2.625 mol of $BaCl_2.2H_2O$ (0.8015 g, FW=244.27 commercially available from STREM), and 0.525 mol $BaBr_2.2H_2O$ (0.2186 g, FW=333.168, commercially available from STREM) were weighted, evenly mixed and grinded, and charged in a alumina crucible. The alumina crucible was then heated in a high temperature furnace. After sintering at 900° C. for 8 hours under 15% $H_2$/85% $N_2$, washing, filtering, and heat drying, a pure phase of the halosilicate phosphor $(Ba_{0.998}Eu_{0.002})_5SiO_{3.85}Cl_{5.250}Br_{1.05}$ was prepared. The excitation wavelength, emission wavelength, and relative emission intensity (in comparison with the phosphor of Example 1) of the described product were measured and the results are shown in Table 2.

TABLE 2

| | excitation wavelength (nm) | emission wavelength (nm) | relative emission intensity |
|---|---|---|---|
| Example 1 | 370 | 442 | 100 |
| Example 2 | 349 | 441 | 31 |
| Example 3 | 358 | 442 | 68 |
| Example 4 | 353 | 442 | 95 |
| Example 5 | 349 | 440 | 31 |
| Example 6 | 372 | 505 | 19 |
| Example 7 | 358 | 437 | 84 |

As shown in Table 2, the phosphors of the invention including various replaced cations (partial Ba replaced by Mg, Ca, Sr, or Zn) or anions (partial Cl replaced by F or Br) achieve various excitation and emission performance characteristics.

COMPARATIVE EXAMPLE 1

Figure 5:
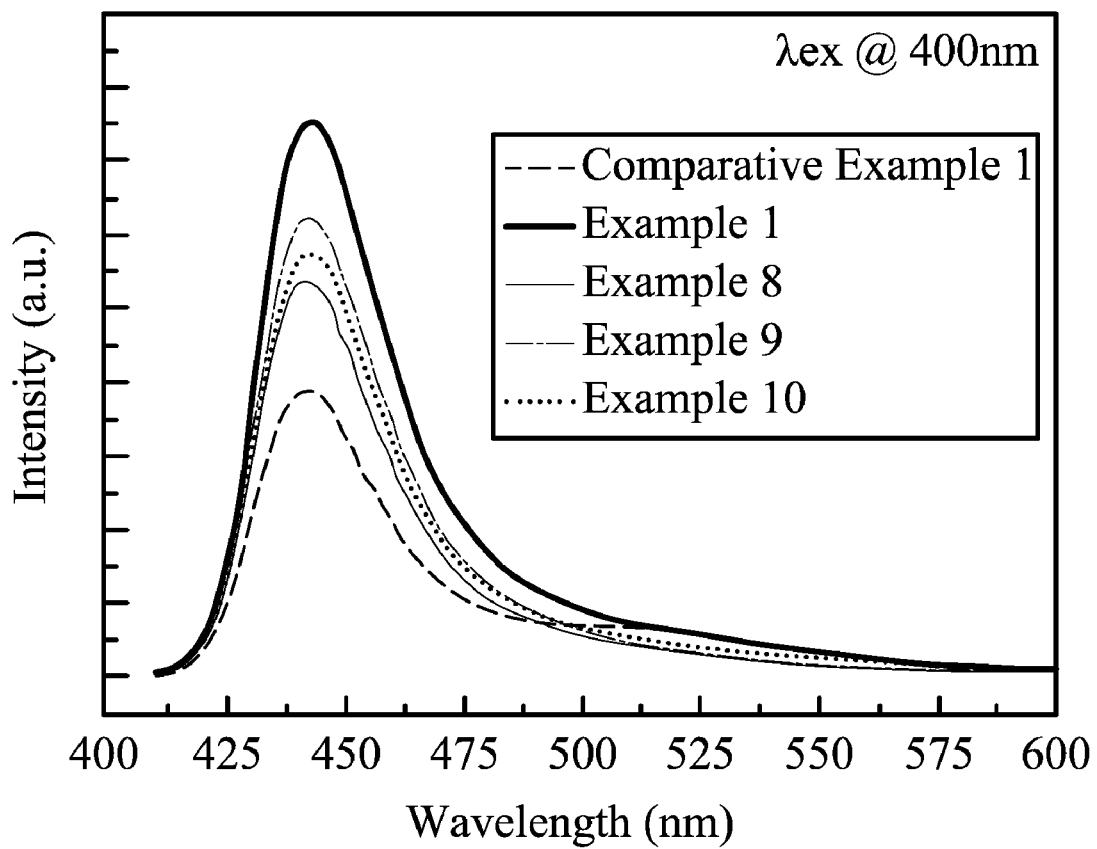
FIG. 5 shows photoluminescence spectra of the phosphors as disclosed in Comparative Example 1 and Examples 1 and 8-10 (excited by a 400 nm violet light).

1.99 mol of $BaCO_3$ (0.4909 g, FW=197.338, commercially available from ALDRICH, 99.99%), 0.005 mol of $Eu_2O_3$ (0.0044 g, FW=351.917, commercially available from ALDRICH), 1.00 mol of $SiO_2$ (0.0751 g, FW=60.084, commercially available from STREM), 3.15 mol $BaCl_2.2H_2O$ (0.9618 g, FW=244.27, commercially available from STREM) were weighted, evenly mixed and grinded, and charged in a alumina crucible. The alumina crucible was then heated in a high temperature furnace. After sintering at 900° C. for 8 hours under 15% $H_2$/85% $N_2$, washing, filtering, and heat drying, a pure phase of the halosilicate phosphor $(Ba_{0.998}Eu_{0.002})_5SiO_4Cl_6$ was prepared. The excitation wavelength, and emission wavelength of the described product were measured and the results are shown in Table 3. The emission wavelength (excited at 400 nm) of the described product is shown in FIG. 5.

EXAMPLE 8

1.99 mol of $BaCO_3$ (0.4909 g, FW=197.338, commercially available from ALDRICH, 99.99%), 0.005 mol of $Eu_2O_3$ (0.0044 g, FW=351.917, commercially available from ALDRICH), 1.00 mol of $SiO_2$ (0.0751 g, FW=60.084, commercially available from STREM), and 3.05 mol of $BaCl_2.2H_2O$ (0.9313 g, FW=244.27, commercially available from STREM), were weighted, evenly mixed and grinded, and charged in a alumina crucible. The alumina crucible was then heated in a high temperature furnace. After sintering at 900° C. for 8 hours under 15% $H_2$/85% $N_2$, washing, filtering, and heat drying, a pure phase of the halosilicate phosphor $(Ba_{0.998}Eu_{0.002})_5SiO_{3.95}Cl_{6.1}$ was prepared. The excitation wavelength, emission wavelength, and relative emission intensity (in comparison with the phosphor of Comparative Example 1) of the described product were measured and the results are shown in Table 3. The emission wavelength (excited at 400 nm) of the described product is shown in FIG. 5.

EXAMPLE 9

1.99 mol of $BaCO_3$ (0.4909 g, FW=197.338, commercially available from ALDRICH, 99.99%), 0.005 mol of $Eu_2O_3$ (0.0044 g, FW=351.917, commercially available from ALDRICH), 1.00 mol of $SiO_2$ (0.0751 g, FW=60.084, commercially available from STREM), and 3.10 mol of $BaCl_2.2H_2O$ (0.9645 g, FW=244.27, commercially available from STREM), were weighted, evenly mixed and grinded, and charged in a alumina crucible. The alumina crucible was then heated in a high temperature furnace. After sintering at 900° C. for 8 hours under 15% $H_2$/85% $N_2$, washing, filtering, and heat drying, a pure phase of the halo silicate phosphor $(Ba_{0.998}Eu_{0.002})_5SiO_{3.9}Cl_{6.2}$ was prepared. The excitation wavelength, emission wavelength, and relative emission intensity (in comparison with the phosphor of Comparative Example 1) of the described product were measured and the results are shown in Table 3. The emission wavelength (excited at 400 nm) of the described product is shown in FIG. 5.

EXAMPLE 10

1.99 mol of $BaCO_3$ (0.4909 g, FW=197.338, commercially available from ALDRICH, 99.99%), 0.005 mol of $Eu_2O_3$ (0.0044 g, FW=351.917, commercially available from ALDRICH), 1.00 mol of $SiO_2$ (0.0751 g, FW=60.084, commercially available from STREM), and 3.5 mol of $BaCl_2.2H_2O$ (1.0687 g FW=244.27, commercially available from STREM), were weighted, evenly mixed and grinded, and charged in a alumina crucible. The alumina crucible was then heated in a high temperature furnace. After sintering at 900° C. for 8 hours under 15% $H_2$/85% $N_2$, washing, filtering, and heat drying, a pure phase of the halosilicate phosphor $(Ba_{0.998}Eu_{0.002})_5SiO_{3.5}Cl_7$ was prepared. The excitation wavelength, emission wavelength, and relative emission intensity (in comparison with the phosphor of Comparative Example 1) of the described product were measured and the results are shown in Table 3. The emission wavelength (excited at 400 nm) of the described product is shown in FIG. 5.

TABLE 3

| | composition | relative emission intensity |
|---|---|---|
| Comparative Example 1 | $Ba_{4.99}Eu_{0.01}SiO_4Cl_6$ | 100 |
| Example 8 | $Ba_{4.99}Eu_{0.01}SiO_{3.95}Cl_{6.1}$ | 136 |
| Example 9 | $Ba_{4.99}Eu_{0.01}SiO_{3.9}Cl_{6.2}$ | 159 |
| Example 1 | $Ba_{4.99}Eu_{0.01}SiO_{3.85}Cl_{6.3}$ | 192 |
| Example 10 | $Ba_{4.99}Eu_{0.01}SiO_{3.5}Cl_7$ | 146 |

As shown in Table 3, the phosphors of the invention as disclosed in Examples 1 and 8-10 have relatively high emissions strength in comparison with Comparative Example 1, since the ratio between halogen (such as chlorine) and oxygen (Cl/O ratio) of the phosphors in the invention is controlled to be more than 1.5. The increased amount of Cl initially causes the relative emission strength to increase, before later decreasing during a period thereafter. The phosphor with Cl/O ratio of 1.63 (disclosed in Example 1) exhibited an optimal emission strength which is larger by about 1.92 times than that of the phosphor with Cl/O ratio of 1.5 disclosed in the Comparative Example 1). It should be noted that there is no disclosure for improving the emission strength by modifying the Cl/O ratio of phosphors represented by $Ba_5SiO_4Cl_6$:$Eu^{2+}$.

EXAMPLE 11

1.97 mol of $BaCO_3$ (0.4859 g, FW=197.338, commercially available from ALDRICH, 99.99%), 0.015 mol of $Eu_2O_3$ (0.0132 g, FW=351.917, commercially available from ALDRICH), 1.00 mol of $SiO_2$ (0.0751 g, FW=60.084, commercially available from STREM), and 3.15 mol of $BaCl_2.2H_2O$ (0.9618 g, FW=244.27, commercially available from STREM), were weighted, evenly mixed and grinded, and charged in a alumina crucible. The alumina crucible was then heated in a high temperature furnace. After sintering at 900° C. for 8 hours under 15% $H_2$/85% $N_2$, washing, filtering, and heat drying, a pure phase of the halosilicate phosphor $(Ba_{0.994}Eu_{0.006})_5SiO_{3.85}Cl_{6.3}$ was prepared. The excitation wavelength, emission wavelength, and relative emission intensity (in comparison with the phosphor of Example 1) of the described product were measured and the results are shown in Table 4.

EXAMPLE 12

1.95 of mol $BaCO_3$ (0.4859 g, FW=197.338, commercially available from ALDRICH, 99.99%), 0.025 mol of $Eu_2O_3$ (0.0220 g, FW=351.917, commercially available from ALDRICH), 1.00 mol of $SiO_2$ (0.0751 g, FW=60.084, commercially available from STREM), and 3.15 mol of $BaCl_2.2H_2O$ (0.9618 g, FW=244.27, commercially available from STREM), were weighted, evenly mixed and grinded, and charged in a alumina crucible. The alumina crucible was then heated in a high temperature furnace. After sintering at 900° C. for 8 hours under 15% $H_2$/85% $N_2$, washing, filtering, and heat drying, a pure phase of the halosilicate phosphor $(Ba_{0.99}Eu_{0.01})_5SiO_{3.85}Cl_{6.3}$ was prepared. The excitation wavelength, emission wavelength, and relative emission intensity (in comparison with the phosphor of Example 1) of the described product were measured and the results are shown in Table 4.

EXAMPLE 13

1.93 of mol $BaCO_3$ (0.4761 g, FW=197.338, commercially available from ALDRICH, 99.99%), 0.035 mol of $Eu_2O_3$ (0.0308 g, FW=351.917, commercially available from ALDRICH), 1.00 mol of $SiO_2$ (0.0751 g, FW=60.084, commercially available from STREM), and 3.15 mol of $BaCl_2.2H_2O$ (0.9618 g, FW=244.27, commercially available from STREM), were weighted, evenly mixed and grinded, and charged in a alumina crucible. The alumina crucible was then heated in a high temperature furnace. After sintering at 900° C. for 8 hours under 15% $H_2$/85% $N_2$, washing, filtering, and heat drying, a pure phase of the halosilicate phosphor $(Ba_{0.986}Eu_{0.014})_5SiO_{3.85}Cl_{6.3}$ was prepared. The excitation wavelength, emission wavelength, and relative emission intensity (in comparison with the phosphor of Example 1) of the described product were measured and the results are shown in Table 4.

EXAMPLE 14

1.90 of mol $BaCO_3$ (0.4909 g, FW=197.338, commercially available from ALDRICH, 99.99%), 0.05 mol of $Eu_2O_3$ (0.0440 g, FW=351.917, commercially available from ALDRICH), 1.00 mol of $SiO_2$ (0.0751 g, FW=60.084, commercially available from STREM), and 3.15 mol of $BaCl_2.2H_2O$ (0.9618 g, FW=244.27, commercially available from STREM), were weighted, evenly mixed and grinded, and charged in a alumina crucible. The alumina crucible was then heated in a high temperature furnace. After sintering at 900° C. for 8 hours under 15% $H_2$/85% $N_2$, washing, filtering, and heat drying, a pure phase of the borate phosphor $(Ba_{0.98}Eu_{0.02})_5SiO_{3.85}Cl_{6.3}$ was prepared. The excitation wavelength, emission wavelength, and relative emission intensity (in comparison with the phosphor of Example 1) of the described product were measured and the results are shown in Table 4.

TABLE 4

| | Composition | relative emission intensity |
|---|---|---|
| Example 1 | $Ba_{4.99}Eu_{0.01}SiO_{3.85}Cl_{6.3}$ | 100 |
| Example 11 | $Ba_{4.97}Eu_{0.03}SiO_{3.85}Cl_{6.3}$ | 105 |
| Example 12 | $Ba_{4.95}Eu_{0.05}SiO_{3.85}Cl_{6.3}$ | 121 |
| Example 13 | $Ba_{4.93}Eu_{0.07}SiO_{3.85}Cl_{6.3}$ | 98 |
| Example 14 | $Ba_{4.9}Eu_{0.1}SiO_{3.85}Cl_{6.3}$ | 36 |

The phosphors disclosed in Examples 1 and 11-14 have various $Eu^{2+}$ doping amounts and the same Cl/O ratio of 1.63. The increased $Eu^{2+}$ doping amount initially causes the relative emission intensity to increase, before later decreasing during a period thereafter. The phosphor with $Eu^{2+}$ doping amount of 5 mol % exhibited an optimal emission strength, which was larger by about 1.21 times than that of the phosphor disclosed in Example 1. The phosphors with $Eu^{2+}$ doping amounts of more than 5 mol % exhibited relatively low emission intensity due to the concentration quenching effect.

EXAMPLE 15

Figure 6:
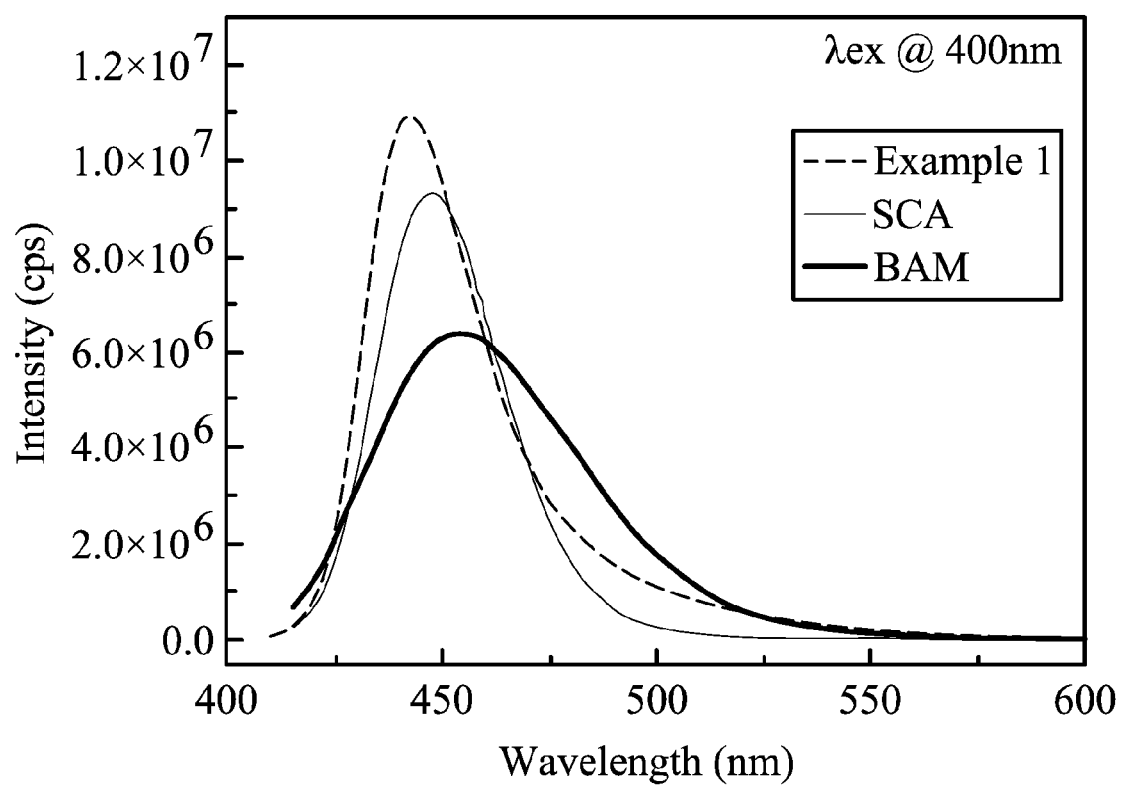
FIG. 6 shows photoluminescence spectra of the phosphor of Example 1, SCA ($(Ca,Sr,Ba)_5(PO_4)_3Cl:Eu^{2+}$) and BAM ($BaMgAl_{10}O_{17}:Eu^{2+}$) (excited by a 400 nm violet light).

The photoluminescence spectra of the phosphor as disclosed in Example 1 and the phosphors available on the market (SCA $((Ca,Sr,Ba)_5(PO_4)_3Cl:Eu^{2+})$ and BAM $(BaMgAl_{10}O_{17}:Eu^{2+})$) were measured and are shown in FIG. 6.

Under an excitation light with a wavelength less than 400 nm, the integral area and emission intensity of the blue phosphor of Example 1 were both larger than those of the phosphors currently commercially available (SCA and BAM). Specifically, the emission intensity of the phosphor of Example 1 was 1.72 times larger than that of the BAM and 1.16 larger than that of the SCA, and the integral area of the phosphor of Example 1 was 1.16 times larger than that of the BAM and 1.28 larger than that of the SCA. The results indicated that the phosphors of the invention, such as the blue phosphor material, may be applied in a white light LED with a light emitting diode chip, wherein near ultraviolet emission is output.

Figure 7:
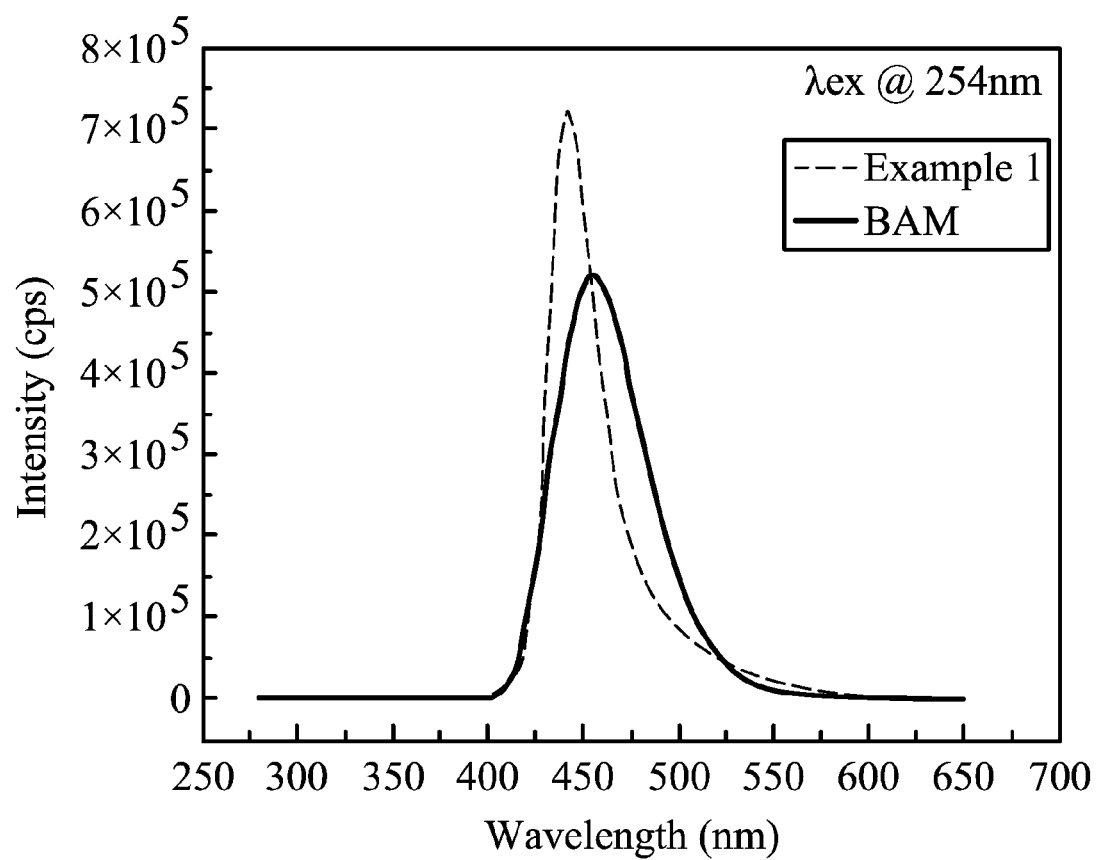
FIG. 7 shows photoluminescence spectra of the phosphor of Example 1 and BAM ($BaMgAl_{10}O_{17}:Eu^{2+}$) (excited by a 254 nm UV light).
Figure 8:
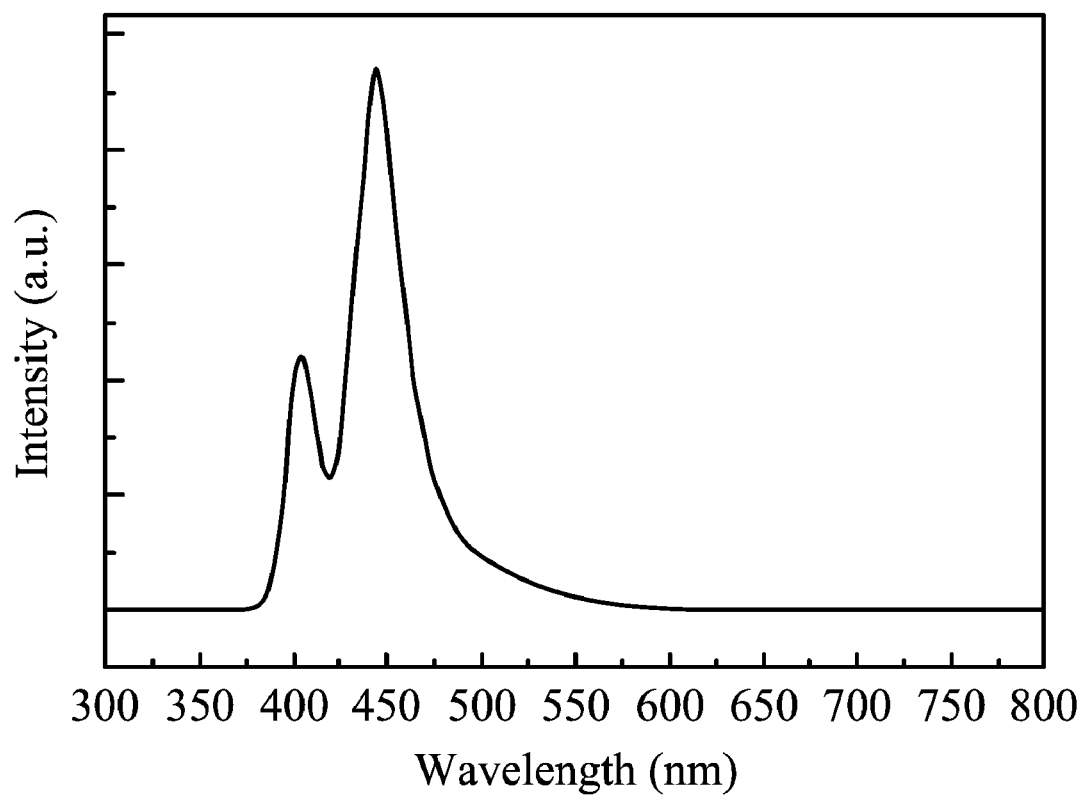
FIG. 8 shows an electroluminescence spectrum of an LED device, a light emitting diode chip with a 400 nm emission light and the phosphor as disclosed in Example 1.

Further, the emission intensity of the phosphors represented by $(Ba_{0.998}Eu_{0.002})_5SiO_{3.85}Cl_{6.30}$ excited by a 254 nm ultraviolet light was greatly larger than that of the BAM, as shown in FIG. 7. Therefore, the phosphors of the invention can also be applied in cold cathode fluorescent lamps (CCFLs) or plasma display panels (PDPs). In an embodiment of the invention, an LED device, a light emitting diode chip with a 400 nm emission light and the phosphors represented by $(Ba_{0.998}Eu_{0.002})_5SiO_{3.85}Cl_{6.30}$ as disclosed in Example 1 was operated at 350 mA, and the electroluminescence spectrum thereof was measured as shown in FIG. 8. As shown, the phosphors of the invention can serve as blue phosphors used in white light LEDs.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phosphor, having a formula:

$(M_{1-x}RE_x)_5SiO_{4-y}X_{6+2y}$ wherein, M is Ba individually or in combination with at least one of Mg, Ca, Sr, or Zn; RE is Y, La, Pr, Nd, Eu, Gd, Tb, Ce, Dy, Yb, Er, Sc, Mn, Zn, Cu, Ni, Lu, or combinations thereof; X is F, Cl, Br, or combinations thereof; $0.001 \leq x \leq 0.6$; and $0.001 \leq y \leq 1.5$.

2. The phosphor as claimed in claim 1, wherein the phosphor comprises $(Ba_{1-x}Eu_x)_5SiO_{4-y}X_{6+2y}$, $[(Ba_{1-z}Mg_z)_{1-x}Eu_x]_5SiO_{4-y}X_{6+2y}$, $[(Ba_{1-z}Ca_z)_{1-x}Eu_x]_5SiO_{4-y}X_{6+2y}$, $[(Ba_{1-z}Sr_z)_{1-x}Eu_x]_5SiO_{4-y}X_{6+2y}$, or $[(Ba_{1-z}Zn_z)_{1-x}Eu_x]_5SiO_{4-y}X_{6+2y}$, wherein $0.001 \leq z \leq 0.4$.

3. The phosphor as claimed in claim 1, wherein the phosphor comprises $(M_{1-x}RE_x)_5SiO_{4-y}Cl_{6+2y}$, $(M_{1-x}RE_x)_5SiO_{4-y}(Cl_{1-w}F_w)_{6+2y}$, or $(M_{1-x}RE_x)_5SiO_{4-y}(Cl_{1-w}Br_w)_{6+2y}$, wherein $0.001 \leq w \leq 0.3$.

4. The phosphor as claimed in claim 1, wherein the phosphor is excited by a light with a wavelength of between 130-430 nm to emit a blue light with a major emission peak of between 445-455 nm.

5. The phosphor as claimed in claim 4, wherein the blue light has a CIE coordination of (0.15, 0.06).

6. A method for fabricating a phosphor, having a formula:

$(M_{1-x}RE_x)_5SiO_{4-y}X_{6+2y}$ wherein, M is Ba individually or in combination with at least one of Mg, Ca, Sr, or Zn; RE is Y, La, Pr, Nd, Eu, Gd, Tb, Ce, Dy, Yb, Er, Sc, Mn, Zn, Cu, Ni, Lu, or combinations thereof; X is F, Cl, Br, or combinations thereof; $0.001 \leq x \leq 0.6$; and $0.001 \leq y \leq 1.5$, comprising:

mixing a mixture comprising the following components: (1) barium- and oxygen-containing compounds; (2) RE- and oxygen-containing compounds; (3) silica; and (4) barium-containing halide; and sintering the mixture under a reductive atmosphere.

7. The method as claimed in claim 6, wherein the mixture further comprises (5) oxygen-containing compounds containing magnesium, calcium, strontium, or zinc.

8. The method as claimed in claim 6, wherein the step of sintering the mixture has a sintering temperature of between 800-1000° C.

9. The method as claimed in claim 8, wherein the mixture is sintered at the sintering temperature for 0.5-32 hrs.

10. The method as claimed in claim 6, wherein the (1) barium- and oxygen-containing compounds comprises barium oxide, barium carbonate, or combinations thereof.

11. The method as claimed in claim 6, wherein the (2) RE- and oxygen-containing compounds comprises oxide containing Y, La, Pr, Nd, Eu, Gd, Tb, Ce, Dy, Yb, Er, Sc, Mn, Zn, Cu, or Ni, or combinations of the previous mentioned metal oxides.

12. The method as claimed in claim 6, wherein the (4) barium-containing halide comprises barium chloride, barium bromide, barium fluoride, or combinations thereof.

13. A light emitting device, comprising:

an excitation light source configured to emit a radiation having a wavelength ranging from about 250 to 420 nm; and the phosphor as claimed in claim 1.

14. The light emitting device as claimed in claim 13, wherein the excitation light source comprises a light emitting diode (LED), a laser diode (LD), a vacuum ultraviolet (VUV), or Hg vapor arc.

15. The light emitting device as claimed in claim 13, wherein the light emitting device comprises an external electrode fluorescent lamp (EEFL), a liquid crystal display (LCD), an organic light emitting diode (OLED), a plasma display panel (PDP), a light emitting diode (LED) device, or a cold cathode fluorescent lamp (CCFL).

16. The light emitting device as claimed in claim 13, wherein the light emitting device is a white light emitting device.

17. The light emitting device as claimed in claim 16, further comprising:

a yellow phosphor.

18. The light emitting device as claimed in claim 16, further comprising:

a green phosphor and a red phosphor.

* * * * *